(12) United States Patent
Sakurai et al.

(10) Patent No.: US 6,455,785 B1
(45) Date of Patent: *Sep. 24, 2002

(54) BUMP CONNECTION WITH STACKED METAL BALLS

(75) Inventors: Hiroyuki Sakurai, Kyoto (JP); Keizo Sakurai, Shiga-ken (JP)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/412,241

(22) Filed: Oct. 5, 1999

(30) Foreign Application Priority Data

Oct. 28, 1998 (JP) .............................. 10-306630

(51) Int. Cl.⁷ ................................ H05K 1/16
(52) U.S. Cl. .................. 174/260; 174/267; 361/768; 361/771; 228/180.22; 257/738
(58) Field of Search ................ 174/260, 267, 174/68.1; 361/767, 768, 771; 228/180.21, 180.22; 257/735, 780

(56) References Cited

U.S. PATENT DOCUMENTS

| | | | |
|---|---|---|---|
| 5,060,844 A | | 10/1991 | Behun et al. |
| 5,147,084 A | | 9/1992 | Behun et al. |
| 5,251,806 A | * | 10/1993 | Agarwala et al. ...... 228/180.22 |
| 5,492,266 A | * | 2/1996 | Hoebener et al. ......... 228/248.1 |
| 5,493,075 A | * | 2/1996 | Chong et al. ................ 174/261 |
| 5,542,601 A | * | 8/1996 | Fallon et al. ................ 228/119 |
| 5,598,036 A | * | 1/1997 | Ho |
| 5,641,113 A | * | 6/1997 | Somaki et al. ......... 228/180.22 |
| 5,767,580 A | * | 6/1998 | Rostoker .................... 257/737 |
| 5,825,629 A | * | 10/1998 | Hoebener et al. ........... 361/777 |
| 5,889,326 A | * | 3/1999 | Tanaka ........................ 257/737 |
| 5,953,623 A | * | 9/1999 | Boyko et al. ............... 438/612 |
| 6,199,273 B1 | * | 3/2001 | Kuno et al. .................... 29/843 |
| 6,225,206 B1 | * | 5/2001 | Jimarez et al. ............. 438/616 |
| 6,229,220 B1 | * | 5/2001 | Saitoh et al. ................ 257/780 |

FOREIGN PATENT DOCUMENTS

| | | | |
|---|---|---|---|
| JP | 58-169918 | | 10/1983 |
| JP | 63-122133 | | 5/1988 |
| JP | 03-062926 | * | 3/1991 ......... H01L/21/321 |
| JP | 4-65534 | | 3/1992 |
| JP | 04-326534 | | 11/1992 |
| JP | 04-334035 | | 11/1992 |
| JP | 05-218046 | | 8/1993 |
| JP | 07-122562 | | 5/1995 |
| JP | 08-264540 | | 10/1996 |
| JP | 09-027501 | | 1/1997 |
| JP | 9-97791 | | 4/1997 |

\* cited by examiner

Primary Examiner—Kamand Cuneo
(74) Attorney, Agent, or Firm—Lawrence R. Fraley

(57) ABSTRACT

A bump connection is formed by stacking at least two metallic balls of different kinds of metals on a conductor of an electronic component such as a semiconductor device. The bump connection is obtained by forming the metallic balls using metallic wires. An apparatus for forming the connection includes a support, capillary member for having a wire pass therethrough, a pair of clamps for clamping the wire, and a "torch" (e.g., electrode, gas flame) which heats the tip of the wire, forming the ball. Successive balls can be formed by this apparatus atop the initially formed ball to provide a stacked configuration.

9 Claims, 18 Drawing Sheets

FIG. 15(a)
FIG. 15(b)
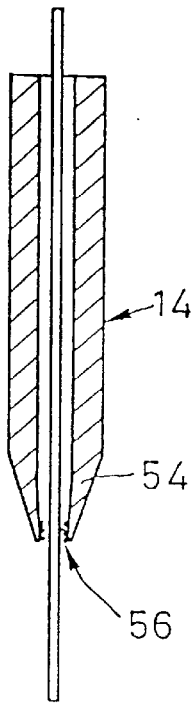
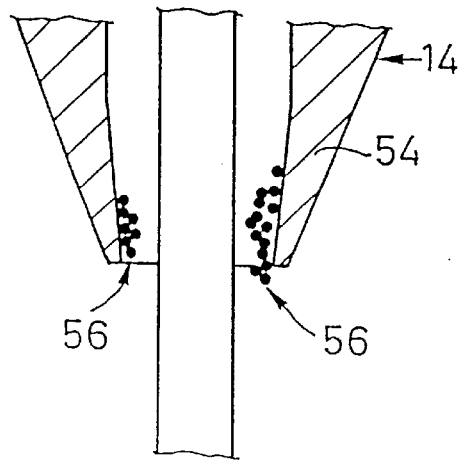
FIG. 16
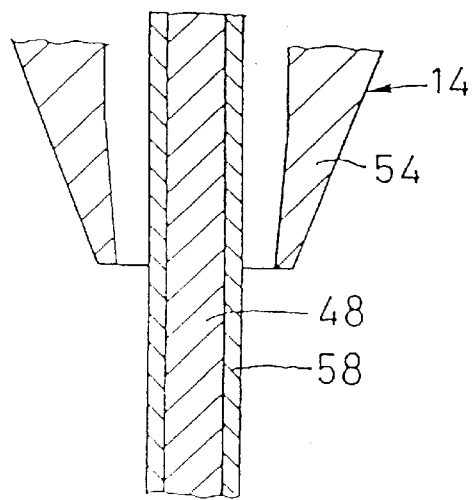

BUMP CONNECTION WITH STACKED METAL BALLS

TECHNICAL FIELD

The present invention relates to electrical connections and a method and an apparatus for forming such connections. More particularly, it relates to the structure of such a connection and a method in which a component, e.g., a semiconductor chip, is directly connected to a conductor formed on a package substrate.

BACKGROUND OF THE INVENTION

Various methods of directly connecting components such as semiconductor chips to an electrode such as a circuit pad conductor formed on a package substrate, e.g., a printed circuit board (PCB), have been conventionally proposed and practiced. As one of these conventional methods, there has been disclosed a method of forming a projecting electrode, as shown in FIG. 25, which includes an upper layer $3a$ of gold or the like formed in a wafer state by a plating method and a lower layer $3b$ of solder or the like having an eutectic composition stacked on the upper layer $3a$ by a plating method (Japanese Laid-Open Patent Publication No. 9-97791).

After forming the electrode in this manner, the wafer is divided into individual semiconductor chips for use in a packaging process, and good chips alone undergo a subsequent procedure while defected chips are scrapped. In the packaging process, by using a semiconductor chip having the projecting electrodes on it, the projecting electrodes formed on the semiconductor chip 6 are positioned in accordance with electrodes 5 formed on the respective, receiving substrate 4. Then, the semiconductor chip 6 is connected to the electrode 5 of the package substrate 4, typically using flux and heating the structure in a reflow furnace.

However, since it is necessary to conduct the plating in a wafer state in this method, if the wafer includes a small number of good chips, the manufacturing unit cost per semiconductor chip becomes relatively higher, and hence, the method cannot always be practically adopted. Furthermore, when problems arise in the procedure for forming the projecting electrodes by the plating method, there is no recovering means. Therefore, the problematic wafer is unavoidably abandoned. In addition, since a wafer is divided into semiconductor chips after forming the projecting electrodes, a wafer having a defect caused in the dividing process is also discarded. Moreover, in the procedure for forming the projecting electrodes by the plating method, various metallic ions can often be mixed in the plating bath used. Therefore, impurities can be deposited in the upper and lower layers, possibly causing a connection failure.

Another technique is disclosed in Japanese Patent Publication No. 4-65534. In this technique, a fine wire is obtained by rapidly solidifying an alloy including a main component of Pb, Sn or In and another additional element. The wire is heated to form a ball, and then it is pulled under the condition where the ball is adhered onto an electrode. The wire is thus cut at the base of the ball, resulting in forming a connection structure. Through this structure, a semiconductor device can then be connected, e.g., to the substrate having the electrode thereon and thus possibly to further substrates, components, etc., in a larger operating system. Owing to the use of the aforementioned alloy wire, the wire can be cut at the base of the ball by pulling it after the ball is adhered onto the conductor. However, when the wire is pulled, an electrode or a wire below the ball may be peeled from the substrate, together with the ball before cutting of the wire at the base occurs.

Still another technique is disclosed in Japanese Laid-Open Patent Publication No. 63-122133. In this publication, a method of connecting a semiconductor chip comprising the steps of forming a ball, pressing and adhering the ball onto an electrode, forming a projecting electrode by cutting a wire, and applying pressure to and electrically connecting a semiconductor chip having the projecting electrode to a conductor on a substrate through a member having anisotropic conductivity are disclosed.

In a semiconductor device manufactured in this manner, the semiconductor chip is electrically connected with the substrate through the member having anisotropic conductivity, and hence, there is a fear of a possible current leakage.

Finally, in issued U.S. Pat. Nos. 5,060,844 and 5,147,084, there is defined an electrical interconnection structure wherein a solder portion, e.g., paste, is positioned on a substrate, e.g., on its conductor pad, and a solder ball is then positioned on the paste. The solder ball has a higher melting point than the paste to allow paste reflow without disturbing the ball integrity.

It is believed that a new and improved bump connection that can be produced relatively expeditiously on a mass production basis and thus at relatively lower costs than some of the foregoing processes would constitute an advancement in the art.

DISCLOSURE OF THE INVENTION

A primary object of the present invention is to provide a new and improved bump form of electrical connection which can be formed in a facile manner, including on a mass production basis.

It is another object to provide such a connection which can be formed to electrically couple very small components such as semiconductor chips to a circuitized substrate.

SUMMARY OF THE INVENTION

According to one aspect of the invention, there is provided a bump electrical connection comprising at least two contiguous metallic balls, each of a different metal than the other, positioned on a conductor of an electronic component in a stacked orientation such that one of the metallic balls is in direct contact with the conductor. For example purposes only, the bump can be formed by stacking a metallic ball of one kind of metal on a respective metallic ball of a different metal.

According to another aspect of the invention, there is provided a bump connection forming apparatus comprising a support member adapted for holding an electronic component therein wherein the component includes a conductor as part thereof, a capillary member including a hole therein through which a first metal wire may pass, a pair of clamps for clamping the first metal wire passed through the hole in the capillary member at a position spaced from the conductor, and a torch for heating a tip portion of the metallic wire to form a first metallic ball thereon, the apparatus adapted for moving the first formed ball and the electronic component toward one another such that the first metallic ball directly contacts the conductor and is secured thereto. Further, even three or more metallic balls can be stacked by this method, if desired. To further enhance the method, when a metallic ball (or balls) made of easily oxidized metal is(are) used, a reducing gas, an inert gas or a mixed gas is preferably blown onto the metallic ball so as not to allow the surface of the metallic ball to be oxidized. A further enhancement to this method is when a metallic ball is used that is made of an alloy, it is possible that the metallic wire to be used is so formed that each constituent metal forms a coat layer. In this situation, the unit volume of each layer of constituent metal is determined so that, when the metallic wire is melted to form a metallic ball, the constituent metals of the respective layers can be mixed with each other into a predetermined, desired composition. For example, the metallic wire may include a constituent metal having a much greater abrasion resistance among the constituent metals as the outermost layer.

BRIEF DESCRIPTION OF THE DRAWINGS

FIGS. 15(a) and 15(b) illustrate a problem which may occur in a bump forming apparatus capillary, FIG. 15(a) being an enlarged sectional view and FIG. 15(b) being an even greater enlarged sectional view of a main part of FIG. 15(a).

FIG. 16 is a much enlarged, sectional view of a main part of the metallic wire and associated capillary according to one aspect of the present invention.

Finally.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. to FIG.

Referring now to the accompanying drawings, preferred embodiments of a bump connection, and a method and an apparatus for forming the bump connection according to the present invention will be described.

Figure 1:
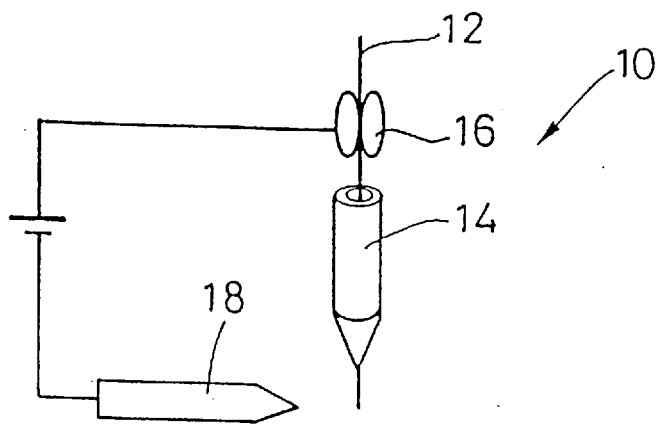
FIG. 1 is a drawing of a bump connection forming apparatus according to one aspect of the present invention.
Figure 1:
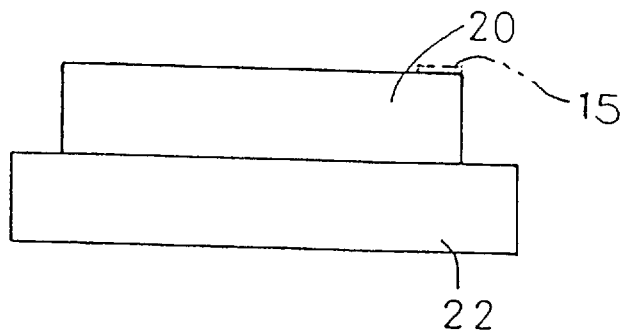

First, a process for forming a bump connection using a metallic, e.g. gold, wire will be described. By the term bump connection as used herein is meant an electrical connection comprising at least two metallic balls placed in contiguous orientation. As shown in FIG. 1, a bump-forming apparatus 10 comprises: a capillary member 14 including a small hole in its axial center through which a wire (such as a gold wire) 12 is threaded; clamps 16 for clamping wire 12 threaded through the axial center of the capillary 14; a "torch" 18 for melting wire 12; and a heating plate 22 capable of heating a semiconductor chip 20 positioned thereon.

Figure 2:
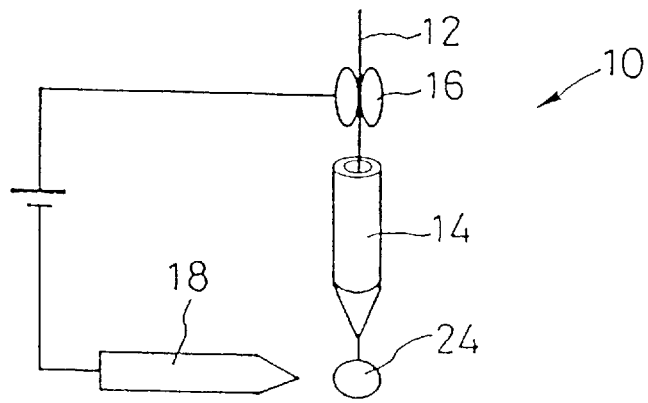
FIG. 2 is a drawing showing a procedure for forming a metallic ball in a method of forming a bump connection according to one aspect of the present invention.
Figure 2:
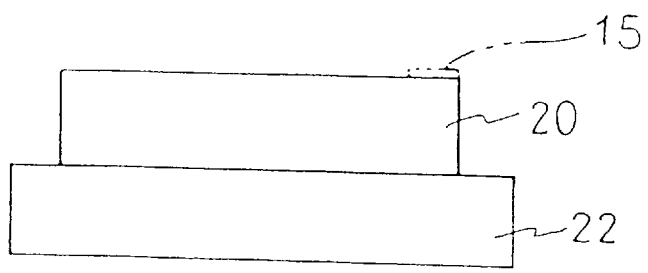

In bump-forming apparatus 10, in order to form a gold ball 24, gold wire 12 is first extruded from the tip of capillary member 14 by a predetermined length of approximately 0.01 to 2.5 mm, as shown in FIG. 2. The wire 12 thus extruded by this predetermined length is fixed by closing clamp 16. "Torch" 18, preferably an electrode for discharging relatively high voltage, is brought close to the tip of the gold wire and discharges a voltage of approximately 1,000 to 4,000 volts (V) onto the tip. The wire is instantly melted, and a gold ball formed. The size of the gold ball 24 can be adjusted depending upon the diameter of the gold wire 12, the voltage applied, the discharge time, and the distance between the torch 18 and wire.

Figure 3:
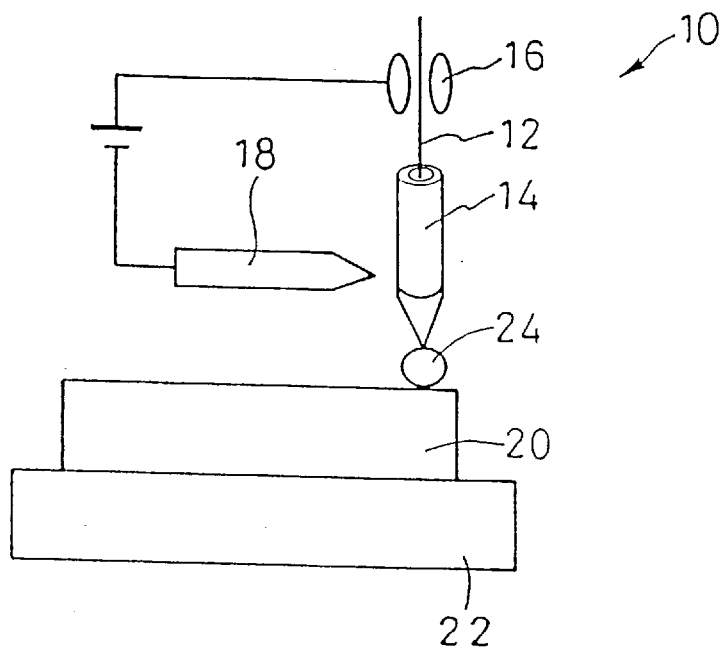
FIG. 3 is a drawing showing a procedure for bonding the metallic ball in the method of forming a bump connection according to one aspect of the present invention.

After forming the gold ball 24, clamp 16 is opened, and the gold ball is moved, together with capillary member 14, toward the semiconductor chip 20 as is shown in FIG. 3, such that the ball contacts a conductor 15 (shown in phantom in FIGS. 1 and 2 only) on the chip. Chip conductors are well known in the art and further description is not needed. The gold ball is bonded to the semiconductor chip's conductor while pressure, ultrasonic vibration and heat are applied to the capillary member. At this point, it is preferred that the semiconductor chip 20 is heated by the heating plate 22 so that the gold ball 24 can be easily adhered onto the chip's conductor.

Figure 4:
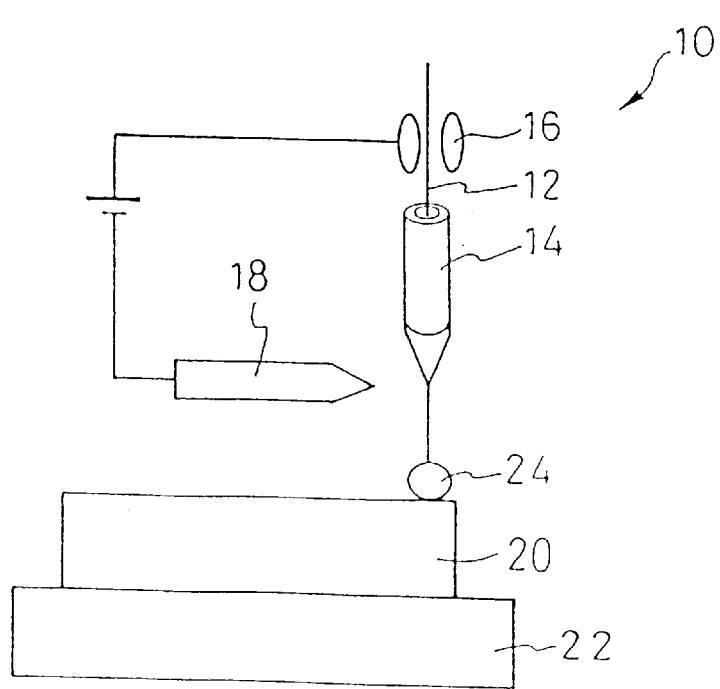
FIG. 4 is a drawing showing a procedure for drawing up a wire from the adhered metallic ball in the method of forming a bump connection according to one aspect of the present invention.
Figure 5:
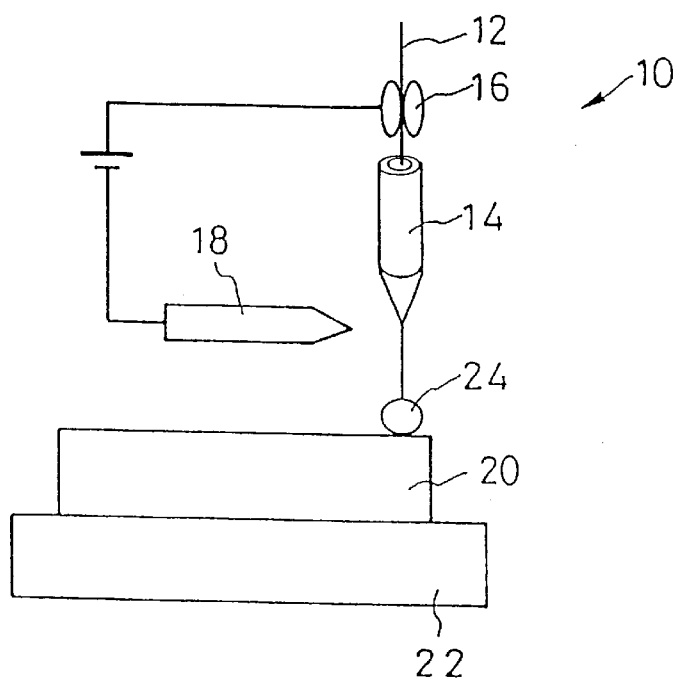
FIG. 5 is a drawing showing a procedure for pulling (with clamps) the wire drawn up from the adhered metallic ball in the method of forming a bump connection according to one aspect of the present invention, and then applying vibration to this wire.
Figure 6:
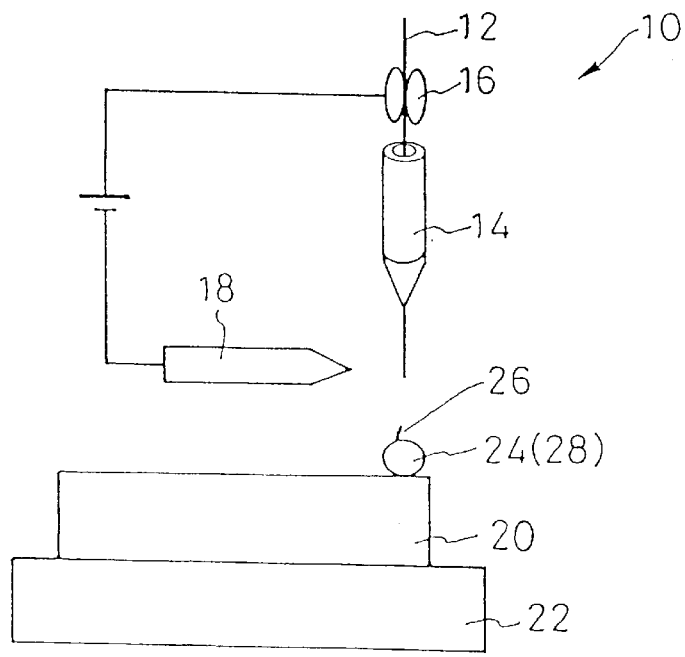
FIG. 6 is a drawing showing a procedure for cutting off the wire drawn up from the adhered metallic ball in FIG. 5.

Next, in order to cut off gold ball 24 from wire 12, the capillary member 14 is moved upward as shown in FIG. 4, but at this point, the remainder of gold wire 12 is still joined to the formed ball 24. When the wire is at a length of approximately 0.01 to 2.5 mm, the clamps 16 disposed above the capillary member 14 are again closed, to fix the gold wire as shown in FIG. 5. Under this condition, the capillary member 14 is moved further upward, while being ultrasonically vibrated. As a result, the gold wire 12 is cut at a point 26 in contact with the gold ball 24 as shown in FIG. 6. At this point, formation of the first metallic ball is considered complete.

In order to form the next metallic ball, on the first formed ball, the aforementioned procedures are repeated, thus forming two contiguous gold balls and the desired bump connection.

Figure 7A:
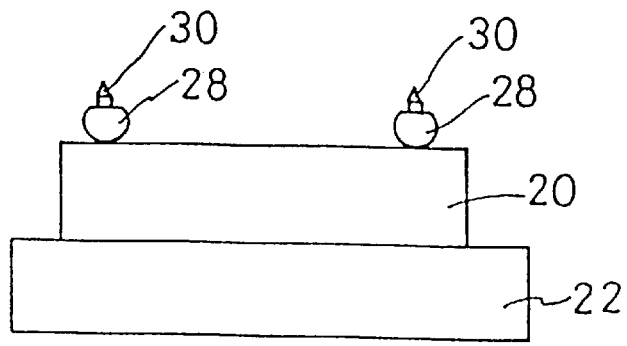
FIGS. 7(a) to 7(c) illustrate respective procedures for adjusting the shape of projections formed on the bump in the method of forming a bump connection according to one aspect of the present invention.
Figure 7B:
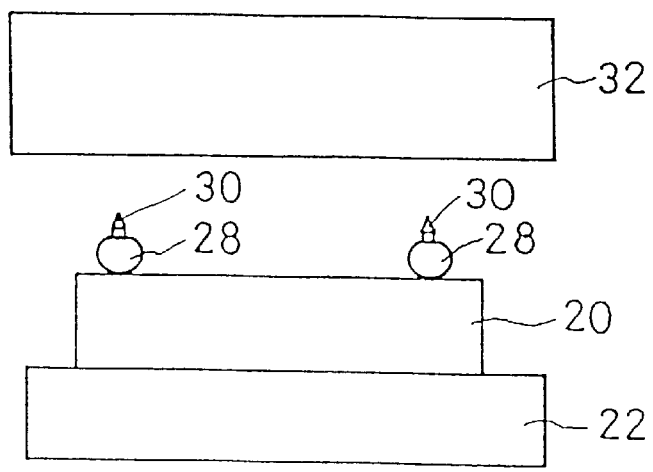
Figure 7C:
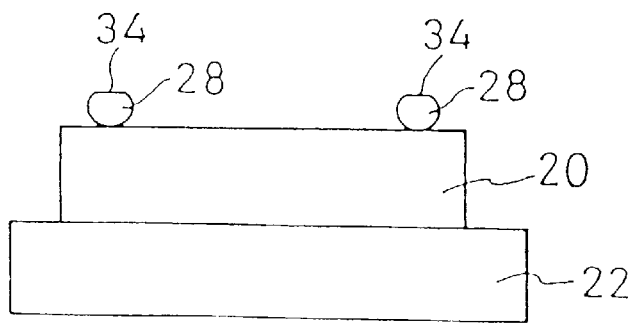

The metallic ball originally formed in this manner includes a projection 30 (FIG. 7(*a*)) that sometimes makes it difficult to stack another metallic ball (e.g., of a different metal) in the subsequent process. For this reason, it is preferred that any such projection 30 be heated and pressed with a metallic plate 32 as shown in FIG. 7(*b*), so as to flatten the upper portion 34 of the ball, as shown in FIG. 7(*c*). Thus, another ball can be relatively easily stacked (positioned) thereon.

Figure 8:
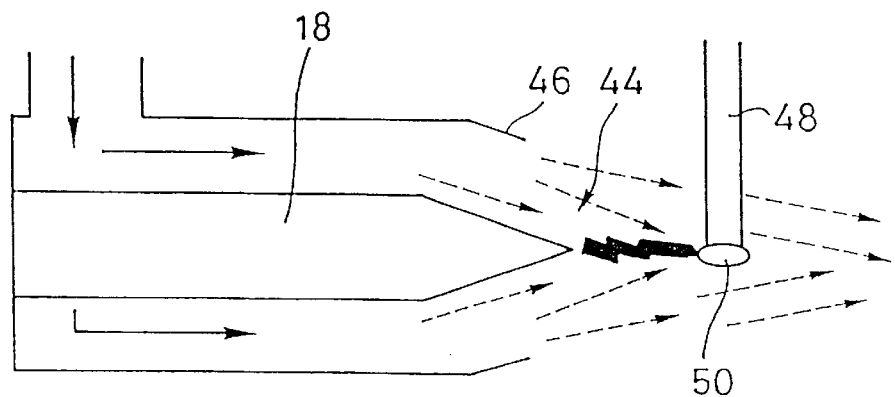
FIG. 8 illustrates another method of forming a bump connection of the present invention.

Next, a method for forming a bump connection according to another aspect of the invention will be described. The basic procedures are the same as those for forming the gold bump 28, but in the case where a ball of a material such as indium is formed, the surface of the indium may be oxidized during solidification to form an oxide film thereon. The formed oxide film works as a barrier when the indium ball is adhered onto a gold bump 28 as previously formed. To prevent this, as shown in FIG. 8, a gas 44, such as a reducing gas including hydrogen and carbon monoxide, an inert gas including argon, nitrogen and carbon dioxide, a mixed gas of a reducing gas and an inert gas, or a heated gas obtained by heating any of these gases, is blown from a nozzle 46 disposed around the electrode 18, so as to clear oxygen from the discharge area. Thus, an indium ball 50 may be formed by melting the indium wire 48 and an oxidized layer thereon is prevented. Also, when a heated gas obtained by heating a reducing gas or the like is used, the heated gas can assist the heat source for melting the indium wire, as well as suppress the oxide formation.

Figure 9:
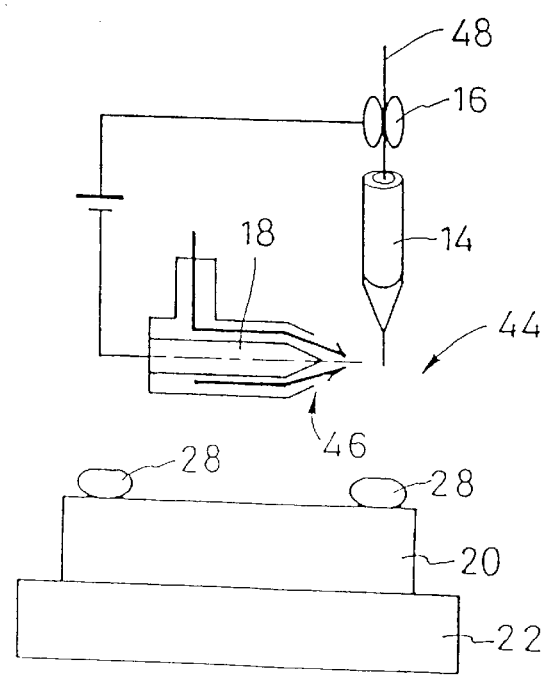
FIG. 9 illustrates an apparatus for stacking a metallic ball on a formed bump according to one aspect of the present invention.
Figure 10:
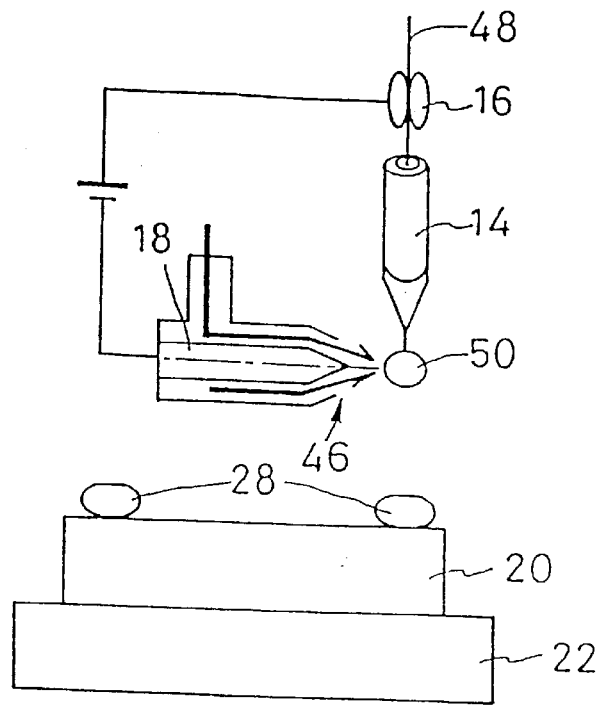
FIG. 10 shows the next step in the procedure illustrated in FIG. 9.
Figure 11:
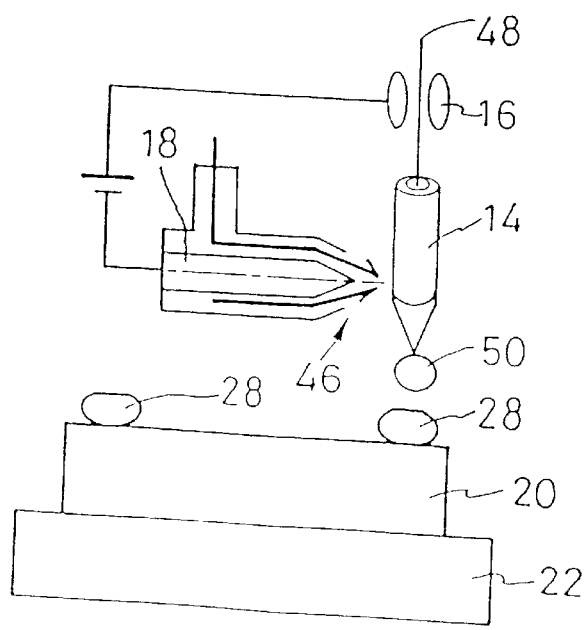
FIG. 11 illustrates the next step in the procedure in FIGS. 9 and 10.

The next step, adhering the indium ball 50 formed at the tip of the capillary member 14 onto the formed gold bump 28 will be described. As shown in FIG. 9, after the indium wire 48 is extruded by a predetermined length from the tip of the capillary member 14, the extruded indium wire 48 is heated while a reducing gas, an inert gas, a mixed gas or a heated gas is blown from the nozzle 46. Thus, as shown in FIG. 10, the indium ball 50 is formed at the tip of the indium wire 48. Then, as shown in FIG. 11, the indium ball 50 is moved to immediately above the gold bump 28 on the semiconductor chip 20 and bonded to the gold bump 28 by pressing with the capillary member 14. Since the indium ball 50 is kept in a molten state and can be easily oxidized until it is adhered onto the gold bump 28 after being formed, the gas is preferably blown from the nozzle 46 until the indium ball 50 is cooled after being joined to the gold bump 28.

Figure 12:
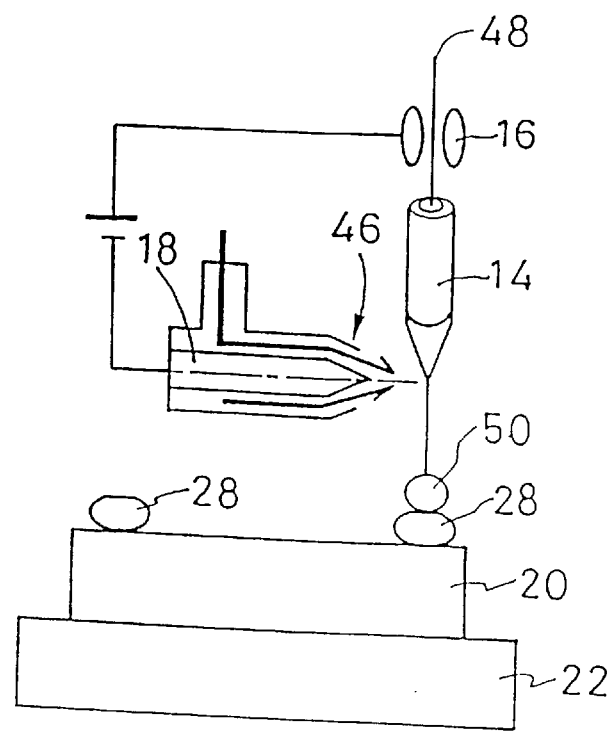
FIG. 12 illustrates the two metallic balls being in contact to form the bump connection according to the method begun in FIG. 9.
Figure 13:
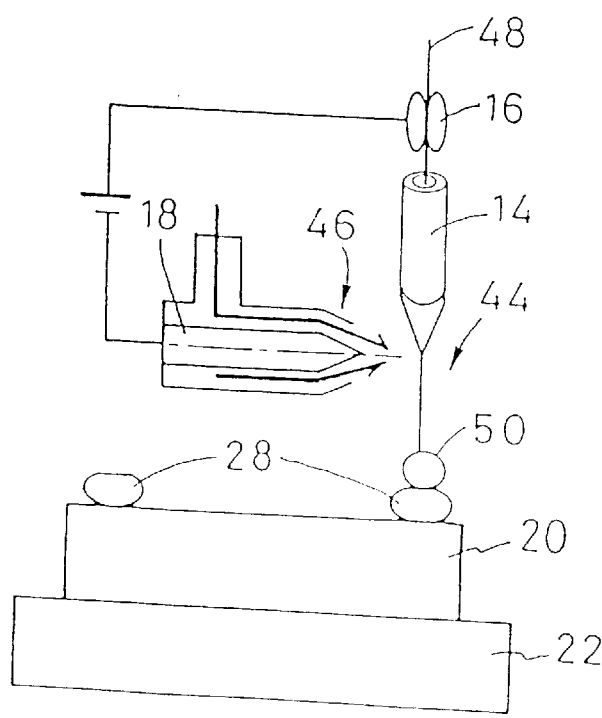
FIG. 13 shows the pulling of clamps holding the wire attached to the formed, dual metallic ball bump connection.
Figure 14:
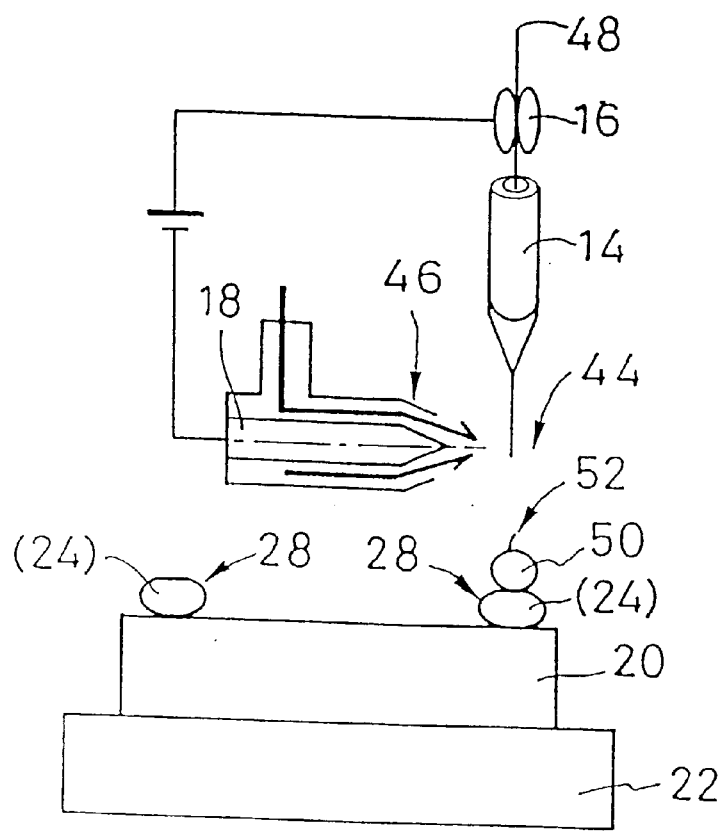
FIG. 14 illustrates the cutting of the wire in FIG. 13.

In order to sever the indium ball 50 from the indium wire 48, capillary member 14 is moved upward as shown in FIG. 12. At this point, as shown, the indium wire is still integrated with (joined to) the indium ball 50. When a length of indium wire 48 about 0.01 to 2.5 mm long is defined, the clamps 16 disposed above the capillary member are closed, thus gripping the indium wire. Under this condition, the capillary member 14 is moved further upward and simultaneously ultrasonically vibrated while gas 44 is blown thereon. As a result, the indium ball 50 is severed (cut) from the wire remainder at a contact point 52 (as shown in FIG. 14). Thus, a bump connection of two metallic balls, stacked one above the other, is formed.

In order to form yet another (3rd) ball 50 (e.g., of indium) on the subsequent bump connection, the aforementioned procedures, starting from the formation of the ball by electric discharge, can be repeated. Thus, more than two vertically stacked balls can be formed.

Metal such as indium is relatively easily abradable under such conditions as desired here. That is, when indium balls are continuously formed and pressed, the indium wire 48 is rubbed against the inner surface of capillary member 14 to possibly produce small metal pieces 56 of indium. These small pieces 56 may plug the capillary at a tip portion 54, as shown in FIGS. 15(*a*) and 15(*b*). In order to avoid this problem, the indium wire 48 is provided with a two-layered or multi-layered structure by covering it with a metal sheath 58 of gold or the like metal having a greater resistance to abrading (and oxidation), as shown in FIG. 16. In this manner, capillary member 14 can be prevented from being plugged and the indium wire 48 can be prevented from being oxidized, so that the resulting indium balls can be expeditiously formed. If the metal to be used in the outer layer is a metal such as gold, silver, palladium and platinum or an alloy of any of these metals, the metal of the inner layer is preferably a metal such as indium, tin, lead, antimony and bismuth or an alloy of any of these metals. Such a metal selected to be used in the first layer further preferably has a higher melting point than the internal metal. For example, the internal layer can be solder, while a metal that has a greater melting point that the solder is selected as the metal for the outer layer. A metallic ball so formed is hereinafter referred to by the outer layer metal (e.g., gold); however, this ball will include another metal (or alloy) as part thereof. When the wire has the structure including two or more layers, the constituent metal having the highest resistance against abrasion and oxidation is used as the outermost layer. Similarly, the first formed metallic ball (that in direct contact with the chip's conductor) may be comprised of gold, silver, platinum, palladium or an alloy thereof and the second formed ball (that directly in contact with the first but not directly contacting the chip conductor) may be comprised of indium, tin, lead, antimony, bismuth or an alloy thereof. The first ball possesses the higher melting point in such an arrangement.

The semiconductor chip 20 provided with the aforedescribed two ball bump connection may now be connected to a package substrate (e.g., to a conductor pad thereon) by using a known method, reflow. In forming this connection, the uppermost ball 50 can be molten but the lower ball (28) is preferably not molten, so as to assure a predetermined distance between the semiconductor chip 20 and substrate after the reflow operation. The metallic ball 28, remaining substantially solid during reflow of ball 50, defines said spaced distance.

As is obvious from the above description, a single semiconductor chip can be provided with a plurality of metallic bump connections. Furthermore, even when a defective metallic ball is produced, the defective metallic ball can be physically removed, since it is formed and then adhered with pressure onto an electrode on the chip. Therefore, should a bump connection failure occur, even a single bump connection alone can be removed and a new bump formed in its place. Moreover, since the metallic balls are preferably formed by instantly melting the metallic wire using electrical discharge, the possibility for incorporation of impurities into the resulting bump structure is substantially prevented.

Figure 17A:
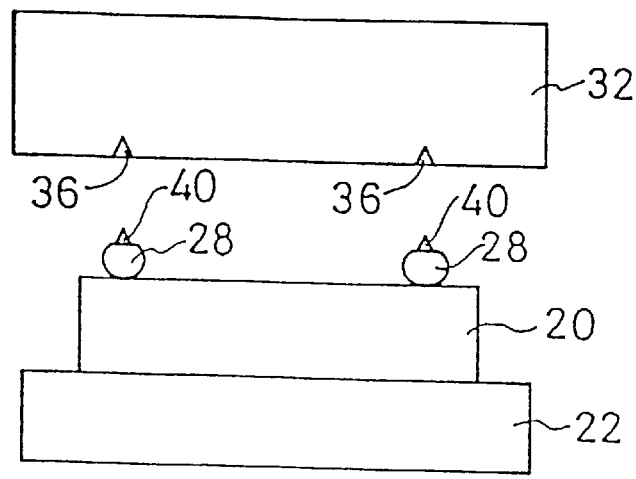
FIGS. 17(a) and 17(b) represent procedures for altering the shape of the bump connection formed according to the present invention.
Figure 17B:
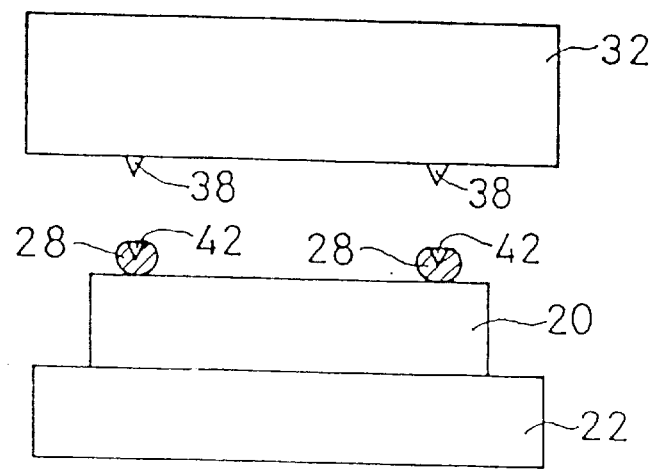

Understandably, the present invention is not limited to the above-described embodiment. For example, in the aforementioned embodiment, the projections 30 (FIGS. 7(a) and 7(b)) that may be formed by the wire 12 on the upper surface of the first formed balls are heated and pressed (with metallic plate 32) to render the ball's upper surface substantially flat. However, when this upper surface is so flattened, adhesion between the first ball 28 and the second ball may be degraded in some situations. To prevent this, the metallic plate 32 can be provided with recesses 36 in appropriate positions (as shown in FIG. 17(a)) and pressed against the upper surfaces of the balls 28, so as to form tapered projections 40 on the upper surfaces of these balls. Alternatively, the metallic plate 32 can be provided with projections 38 in appropriate positions as shown in FIG. 17(b), so as to form recesses 42 within the upper surfaces of the gold balls 28. In both cases, bonding between both balls in each bump connection is enhanced. The shapes of these recesses 36 and projections 38 are not limited to tapered as shown and other shapes are possible. If the projections 30 formed are relatively small (and thus negligible), it is not always necessary to flatten the described upper surfaces using a metallic plate.

Figure 18:
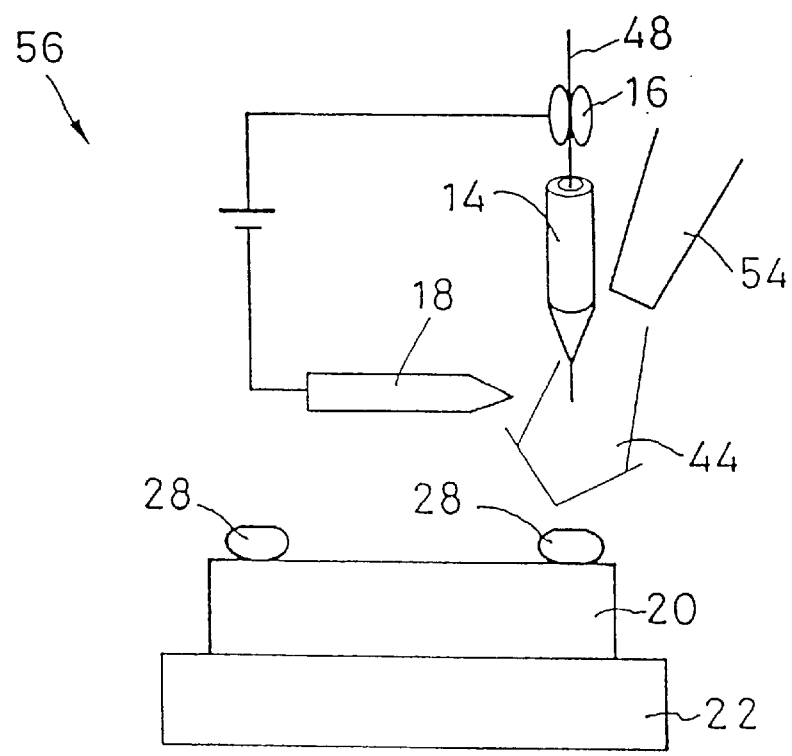
FIG. 18 is yet another drawing showing another apparatus for forming a stacked metallic ball connection according to another aspect of the present invention.

The apparatus for forming the above bump connections is not limited to that described above. For example, as shown in FIG. 18, a bump forming apparatus 56 can comprise the capillary member 14 having a small hole in its axial center for threading a wire 48 through it, clamp 16 for clamping the wire threaded through the axial center of the capillary member 14, the torch 18 for melting the wire 48, and, significantly, a nozzle 54 disposed separately from the torch 18. A heating plate 22 capable of heating the semiconductor chip is also provided as part of this apparatus. In this apparatus (56), the direction of the nozzle 54 for blowing the gas 44 (such as a reducing gas) can be adjusted for optimum gas flow.

Figure 19:
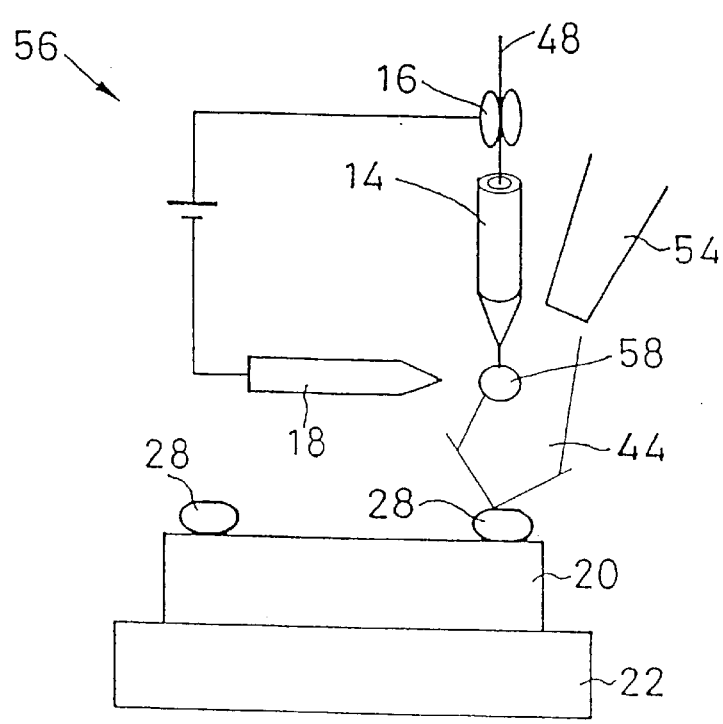
FIG. 19 illustrates the next step in the method of FIG. 18.
Figure 20:
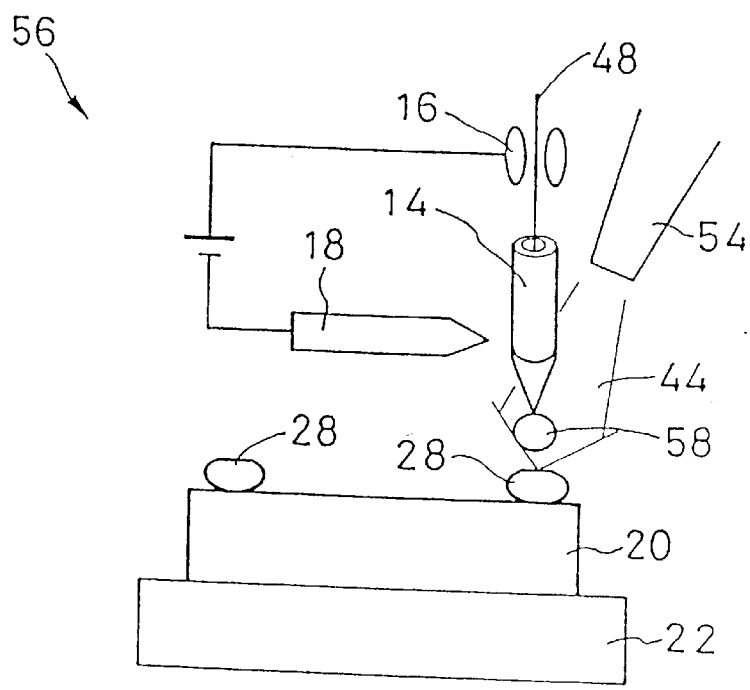
FIG. 20 shows the next step in the method begun in FIG. 18.
Figure 21:
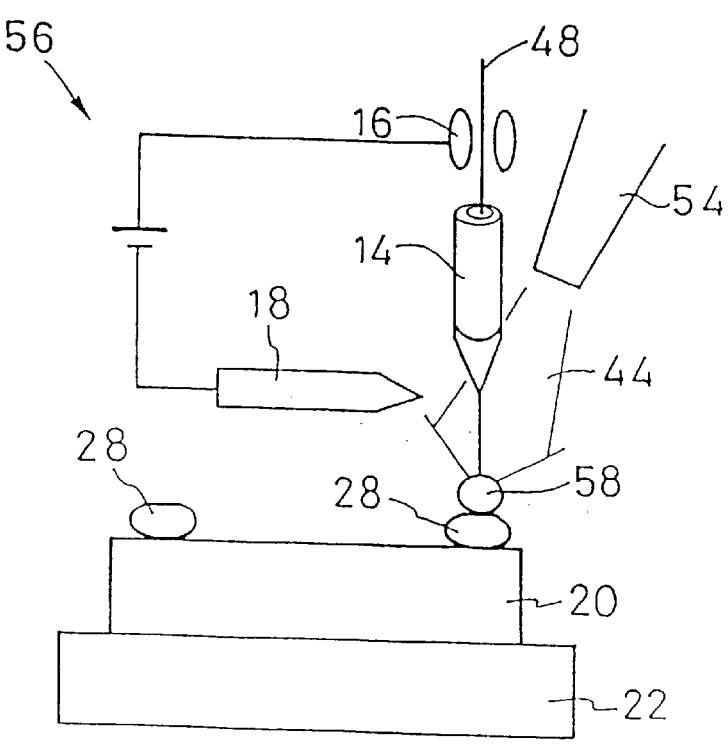
FIGS. 21–23 illustrate the final three steps in the method begun in FIG. 18.
Figure 22:
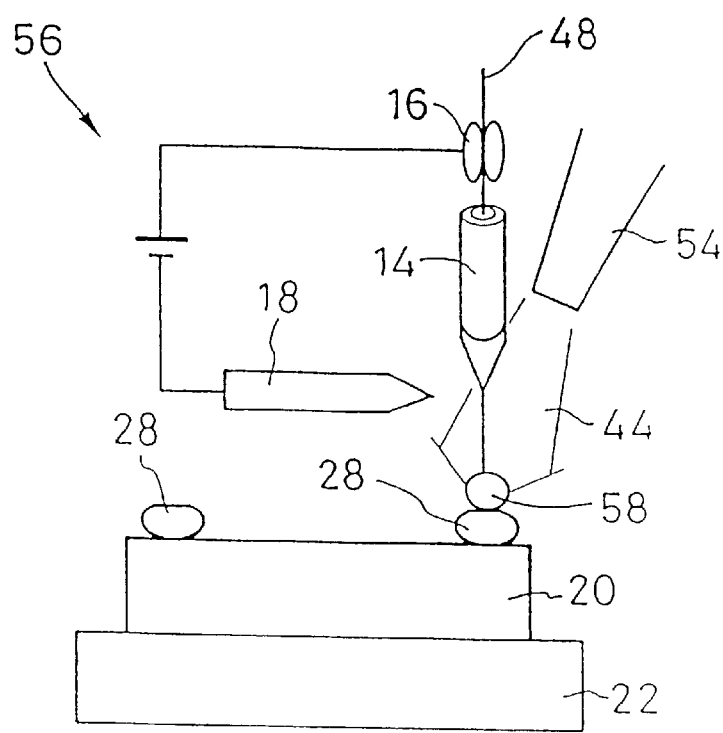
Figure 23:
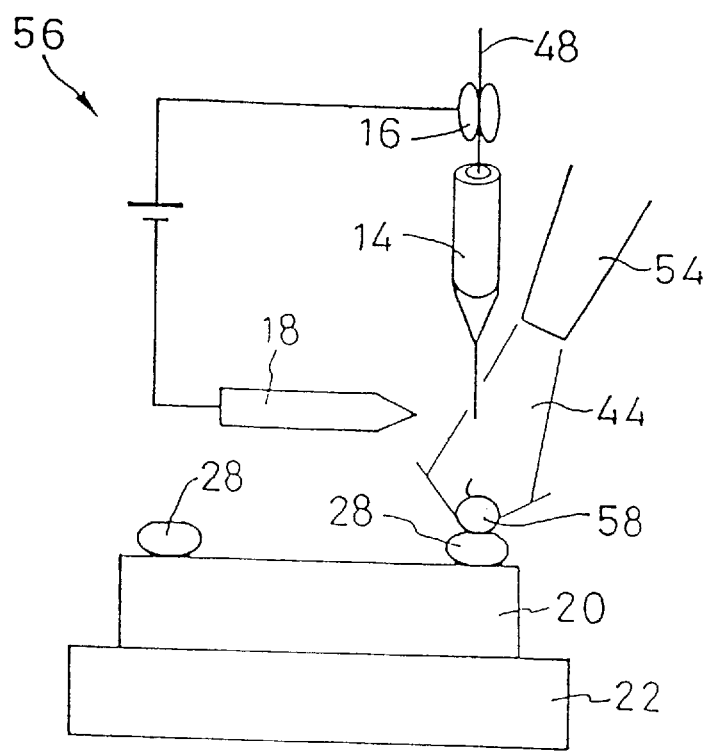

In apparatus 56, a length of wire 48 is first extruded from capillary member 14 (as shown in FIG. 18), the wire 48 then heated to a molten state by torch 18 while gas 44 is blown from nozzle 54 toward the tip of the capillary member 14 (as shown in FIG. 19). Thus, a ball 58 is formed. Immediately after forming ball 58, clamps 16 are opened to release the wire 48, and the ball 58 and capillary member are moved down onto the already formed ball 28 on chip 20 (as shown in FIG. 20). The ball 58 is stacked on and bonded to the gold bump 28 (FIG. 21), and then cooled. Thereafter, the capillary member 14 is moved upward with the wire 48 still bonded to ball 58. The clamps 16 are closed to secure wire 48 in place. Next, while being moved upward by clamps 16, wire 48 is heated with torch 18 to be cut off as shown in FIG. 23. Since gas 44 is constantly blown from nozzle 54 during these procedures, the ball 58 is covered with the gas 44 to prevent it from forming an oxidized layer thereon. Accordingly, the metallic ball 58 is firmly bonded to the first ball 28.

Figure 24A:
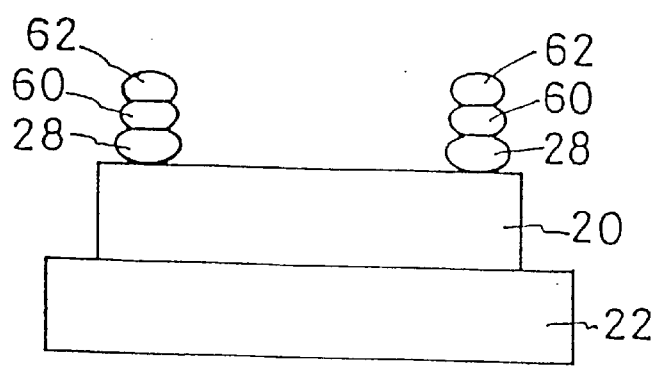
FIGS. 24(a) and 24(b) are front, elevational views, showing another embodiment of a bump connection that can be formed according to the teachings of the present invention.
Figure 24B:
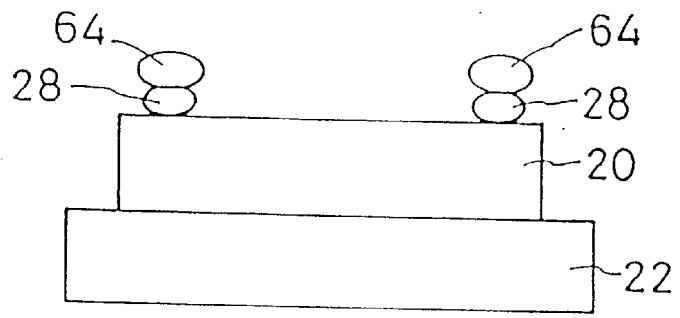
Figure 25:
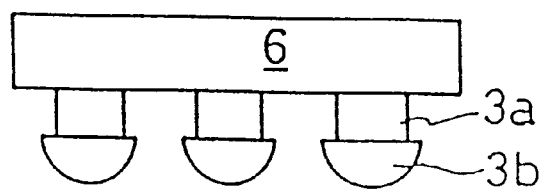
FIG. 25 represents the aforementioned, alternative method of forming a connection as described in the Japanese Laid-Open Patent Publication No. 9-97791.
Figure 25:
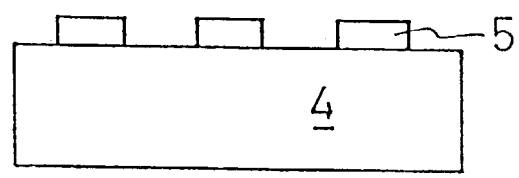
Figure 25:
Figure 25:
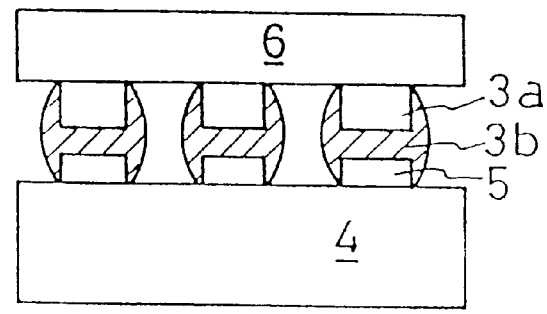

As mentioned above, a two-ball structure of the bump so formed is not meant to limit the scope of the invention. For example, as shown in FIG. 24(a), the bump connection can be a three-ball, stacked structure in which second and third metallic balls 60 and 62 are stacked on the first ball 28. The gold ball 28 and the metallic balls 60 and 62 can be of substantially the same size, or their sizes can be gradually decreased as the distance from the chip increases. Alternatively, as shown in FIG. 24(b), a second metallic ball larger than the first ball 28 can be bonded to ball 28. In this situation, the metallic ball 64 is preferably a solder component for the overall bump connection.

That is, the metallic ball which is lowermost is preferably composed of metal that does not become molten during soldering, while the uppermost metallic ball is preferably composed of metal that becomes molten during reflow, to thus facilitate electrically connecting the structure to another substrate. In a three or more ball structure, as long as the uppermost metallic ball and the lowermost metallic ball are respectively composed of such lower melting point materials, a connection of such metals can be readily formed.

As clearly seen in the drawings, especially in FIGS. 11–13 and 19–22, there is no additional material adjacent the substantially round balls (especially ball 28) during securement of the second ball (i.e., 50 or 58). As further seen in the drawings (especially FIGS. 12–14 and 19–24(b)), each of the attached balls (24, 28, 50, 58) is of substantially round configuration.

Having described preferred embodiments of the present invention with reference to the accompanying drawings, the present invention is not limited to those embodiments shown in these drawings. For example, the semiconductor device on which the bump connection of the present invention is formed is preferably a semiconductor chip, but it is not limited to a semiconductor chip. Such a bump connection can be readily formed on a conductor of a module or PCB, depending on the type of connection desired.

Furthermore, the described method of providing gas may include alternating or mixing the above gases, as long as the resulting gas prevents oxide formation on the surface of one or both of the metallic balls. Thus, any method can be adopted as long as a metallic ball is formed that does not include an oxide layer thereon before bonding this ball to the next element.

Furthermore, it is preferred that any of the aforementioned gases be locally blown from a nozzle in order to cover the target with the gas. However, it is possible to position the bump forming apparatus in a chamber or the like filled with an atmosphere of such a reducing gas, an inert gas or mixed gas. Alternatively, only the part of the apparatus where the metallic ball is formed may be so positioned.

Still further, the pressing means (e.g., 32 in FIG. 7(b)) described here can be heated during such pressing.

While there have been shown and described what are at present the preferred embodiments of the invention, it will be obvious to those skilled in the art that various changes and modifications may be made therein without departing from the scope of the invention as defined by the appended claims.

What is claimed is:

1. A bump connection comprising first and second contiguous metallic balls, each of a substantially round configuration and of a different metal than the other, positioned on a conductor of an electronic component in a stacked orientation such that said first of said substantially round metallic balls is in direct contact with said conductor, there being no additional material adjacent said contiguous first and second metallic balls, said bump connection further including a third metallic ball also of substantially round configuration and positioned atop said second metallic ball.

2. The bump connection according to claim 1, wherein said substantially round first metallic ball positioned in direct contact with said conductor possesses a melting point higher than the melting point of said substantially round second metallic ball.

3. The bump connection according to claim 1, wherein said substantially round first metallic ball positioned in direct contact with said conductor is comprised of a metal that does not substantially become molten during solder reflow while said substantially round second metallic ball is comprised of a metal that does become molten during such reflow.

4. The bump connection according to claim 1 wherein said substantially round first metallic ball positioned in direct contact with said conductor includes a substantially flat surface prior to being connected to said substantially round second metallic ball.

5. The bump connection according to claim 1 wherein said conductor is part of a semiconductor chip.

6. The bump connection according to claim 5 wherein said bump connection is adapted for electrically coupling said semiconductor chip to a circuitized substrate.

7. The bump connection according to claim 6 wherein said circuitized substrate is a printed circuit board.

8. The bump connection of claim 1 wherein said substantially round first metallic ball positioned in direct contact with said conductor is comprised of a metal selected from the group of metals consisting of gold, silver, platinum, palladium or alloys thereof and said substantially round second metallic ball is comprised of a metal selected from the group of metals consisting of indium, tin, lead, antimony, bismuth or alloys thereof.

9. The bump connection according to claim 8 wherein said substantially round first metallic ball in direct contact with said conductor is gold and said substantially round second metallic ball is indium.

* * * * *